United States Patent
Shimizu et al.

(10) Patent No.: US 7,670,434 B2
(45) Date of Patent: Mar. 2, 2010

(54) VAPOR PHASE GROWTH APPARATUS

(75) Inventors: Eiichi Shimizu, Toda (JP); Nobuhito Makino, Toda (JP); Manabu Kawabe, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 91 days.

(21) Appl. No.: 10/589,348

(22) PCT Filed: Feb. 15, 2005

(86) PCT No.: PCT/JP2005/002225

§ 371 (c)(1),
(2), (4) Date: Aug. 11, 2006

(87) PCT Pub. No.: WO2005/081298

PCT Pub. Date: Sep. 1, 2005

(65) Prior Publication Data

US 2007/0163504 A1      Jul. 19, 2007

(30) Foreign Application Priority Data

Feb. 25, 2004    (JP) .............................. 2004-049125

(51) Int. Cl.
*H01L 21/00*    (2006.01)
*C23C 14/00*    (2006.01)
*C23C 16/00*    (2006.01)

(52) U.S. Cl. ........................ 118/725; 188/728; 188/724; 156/345.52; 156/345.51; 156/345.53

(58) Field of Classification Search .................. 118/725, 118/728

See application file for complete search history.

(56) References Cited

U.S. PATENT DOCUMENTS

| | | | | |
|---|---|---|---|---|
| 5,800,622 A | * | 9/1998 | Takemi et al. ................ | 118/725 |
| 6,001,183 A | * | 12/1999 | Gurary et al. ................ | 118/720 |
| 6,494,955 B1 | * | 12/2002 | Lei et al. ..................... | 118/715 |
| 7,344,597 B2 | * | 3/2008 | Shimizu et al. ............. | 117/216 |

(Continued)

FOREIGN PATENT DOCUMENTS

CA        2486662 A1    12/2003

(Continued)

*Primary Examiner*—Ram N Kackar
(74) *Attorney, Agent, or Firm*—Birch, Stewart, Kolasch & Birch, LLP

(57) ABSTRACT

It is to provide a vapor phase growth apparatus which can perform vapor phase growth of a thin film having a good uniformity throughout a surface of a wafer. The vapor phase growth apparatus includes at least a sealable reactor, a wafer containing member (wafer holder) installed within the reactor and having a wafer mounting portion (pocket hole) on a surface thereof for holding a wafer, a gas supply member (gas inlet pipe) for supplying raw material gas towards the wafer, a heating member (heater) for heating the wafer, and a heat uniformizing member (susceptor) for holding the wafer containing member and uniformizing heat from the heating member, wherein raw material gas is supplied into the reactor in a high temperature environment while heating the wafer by using the heating member via the heat uniformizing member and the wafer containing member, to form a film grown on a surface of the wafer, and wherein a recess portion depressed in a dome shape is formed at a back side of the wafer containing member.

6 Claims, 3 Drawing Sheets

U.S. PATENT DOCUMENTS

| | | |
|---|---|---|
| 2002/0162630 A1 | 11/2002 | Satoh et al. |
| 2004/0187790 A1* | 9/2004 | Bader et al. .................. 118/728 |
| 2005/0166836 A1 | 8/2005 | Shimizu et al. |
| 2005/0217564 A1 | 10/2005 | Shimizu et al. |

FOREIGN PATENT DOCUMENTS

| | | | |
|---|---|---|---|
| CA | 2486664 A1 | | 12/2003 |
| EP | 0519608 A1 | | 12/1992 |
| JP | 59-44818 A | | 3/1984 |
| JP | 61-242014 A | | 10/1986 |
| JP | 2-151024 A | | 6/1990 |
| JP | 06-124901 | * | 5/1994 |
| JP | 6-124901 A | | 5/1994 |
| JP | 11-8119 A | | 1/1999 |
| JP | 2000-355766 | * | 12/2000 |
| JP | 2000-355766 A | | 12/2000 |
| JP | 2003-318116 A | | 11/2003 |
| WO | WO 03/107403 A1 | * | 12/2003 |

* cited by examiner (a)

(b)

(a)

(b)

VAPOR PHASE GROWTH APPARATUS

TECHNICAL FIELD

The present invention relates to a vapor phase growth apparatus which performs vapor phase growth of a thin film such as compound semiconductor on a wafer surface by supplying raw material gas in an high-temperature environment while heating the wafer, and particularly to a technology for achieving a uniform in-plane temperature distribution of a wafer.

BACKGROUND ART

Vapor phase growth is employed in various areas of the industry world today. Needless to say, it is required for this vapor phase growth that a thin film grown on a wafer has a uniform thickness, composition, and doping concentration throughout the plane thereof. In order to unformalize in-plane film thickness and the like, various possible methods to be used are considered. Among them, a technology to achieve uniform temperature of a wafer when the wafer is heated, is the most important factor.

FIG. 5 is a cross-sectional view showing a construction example of a typical conventional vapor phase growth apparatus. As shown in FIG. 5, a vapor phase growth apparatus 100 includes a reactor 1, a wafer holder 3 on which wafers 2 are placed, a susceptor 4 on which the wafer holder 3 is mounted, a heater 5 provided below the susceptor 4, a rotation mechanism 6 which rotatably supports the wafer holder 3 and the susceptor 4, gas inlet pipes 7 through which raw material gas or carrier gas is supplied, a gas exhaust pipe 8 through which unreacted gas is exhausted, and the like.

FIG. 6 is enlarged views showing construction of the wafer holder 3 in detail; (a) is a plan view, and (b) is a cross-sectional view taken along the line A-A of (a). On one side of the wafer holder 3, a plurality (6 in FIG. 6) of circular pocket holes $3a$ are formed along the same circumference, in which wafers 2 are placed, and on the other side, the wafer holder 3 is in contact with the susceptor 4.

Note that the susceptor 4 is made of a material having high thermal conductivity (for example, molybdenum and the like) in order to transfer heat from the heater 5 uniformly. It is also typical to use graphite or molybdenum having high thermal conductivity, for the wafer holder 3.

In the vapor phase growth apparatus having the above construction, by heating the bottom of the susceptor 4 using the heater 5, heat is transferred to the wafers 2 via the susceptor 4 and the wafer holder 3 so that the wafers 2 reach a predetermined temperature. In addition, by rotating the susceptor 4 at a predetermined rotating speed using the rotation mechanism 6, vapor phase growth of a thin film is performed while supplying raw material gas and carrier gas that has been introduced from the gas inlets 7 onto the surfaces of the wafers 2 uniformly.

Further, in FIGS. 5 and 6, the wafer holder 3 on which the wafers 2 are mounted is made from a single member. However, when a plurality of wafers are mounted, there is a proposed vapor phase growth apparatus in which a plurality of wafer holders are provided to correspond to a plurality of wafers mounted thereon, and the plurality of wafer holders are mounted on predetermined positions of a susceptor. (For example, see Patent Document 1). Patent Document 1: Japanese Patent Laid-Open Publication No. Heisei 11-8119

DISCLOSURE OF THE INVENTION

Problem to be Solved by the Invention

However, it has been found that, in the above-mentioned vapor phase growth apparatus 100, the in-plane temperature distribution of the surface of the entire wafer holder 3 including the wafers 2, which is parallel with the wafers 2, is greatly irregular. In addition, when a temperature distribution of the wafer holder itself was investigated, it was found that the central portion of the surface of the wafer holder has higher temperature than the edge portion thereof (by 15° C. or more, for example).

It is considered that this temperature difference is caused by a heating method and installed position of the heater 5, or differences in thermal conductivity (thermal diffusivity) among the susceptor 4, the wafer holder 3 and wafers 2, and contact thermal resistance thereof. In other words, the contacts between solid bodies such as between the susceptor 4 and the wafer holder 3, between the wafer holder 3 and the wafers 2, are not complete surface contacts but discontinuous surface contacts (aggregation of point contacts). Therefore, it is considered that thermal resistance in each border surface becomes irregular, and the temperature distribution of the wafer holder 3 (including the wafers 2) is deteriorated. As a result, in the conventional vapor phase growth apparatus, the in-plane temperature distribution of each wafer 2 becomes uneven, and it has thus been difficult to perform vapor phase growth of a thin film with excellent uniformity throughout the surface of the wafer 2.

The present invention has been accomplished to solve the above problem, and an object of the present invention is to provide a vapor phase growth apparatus which can perform vapor phase growth of a thin film with good uniformity throughout a surface of a wafer by improving an in-plane temperature distribution of a wafer.

Means for Solving the Problem

According to the present invention, the vapor phase growth apparatus includes at least a sealable reactor, a wafer containing member (wafer holder) installed within the reactor and having a wafer mounting portion (pocket hole) on a surface thereof for holding a wafer, a gas supply member (gas inlet pipe) for supplying raw material gas towards the wafer, a heating member (heater) for heating the wafer, and a heat uniformizing member (susceptor) for holding the wafer containing member and uniformizing heat from the heating member, wherein raw material gas is supplied into the reactor in a high temperature environment while heating the wafer by using the heating member via the heat uniformizing member and the wafer containing member, to form a film grown on a surface of the wafer, and wherein a recess portion depressed in a dome shape is formed at a back side of the wafer containing member.

Thus, a space filled with gas having low heat conductivity is formed between the wafer containing member and the heat uniformizing member, and the larger the space becomes, that is, the closer to the central portion of the dome-shaped recess portion (the central portion of the wafer containing member), the lower the heat transmission efficiency becomes. Therefore, temperature was higher at the central portion than the rest of the areas in a conventional wafer containing member, however, by the wafer containing member of the present invention, a temperature difference between the central portion and the edge portion can be reduced.

Further, when a height and a diameter of the recess portion provided in the wafer containing member are represented by H and D, respectively, a ratio of the height and the diameter H/D is between 0.01 and 2.00%. More preferably, the ratio of the height and the diameter H/D of the dome-shaped recess portion is between 0.50 and 1.50%. Thus, a temperature difference between the central portion and the edge portion on the surface of the wafer containing member can be reduced to 10° C. or smaller.

Moreover, it is preferred that the height H of the dome-shaped recess portion provided in the wafer containing member be between 0.01 and 3.00 mm. Accordingly, because a space formed by the dome-shaped recess portion is limited, it is possible to minimize a reduction of heat transmission efficiency due to the space.

Effect of the Invention

According to the present invention, since the recess portion depressed in a dome shape is formed at the back side of the wafer containing member, a temperature difference between the central portion and the edge portion of the wafer containing member becomes small, and heat is transmitted evenly to a wafer mounted on the wafer containing member. As a result, because the temperature throughout the entire surface of the wafer becomes uniform, an effect that vapor phase growth of a thin film having a good uniformity is realized, can be obtained.

EXPLANATION OF REFERENCE NUMERALS

Figure 1:
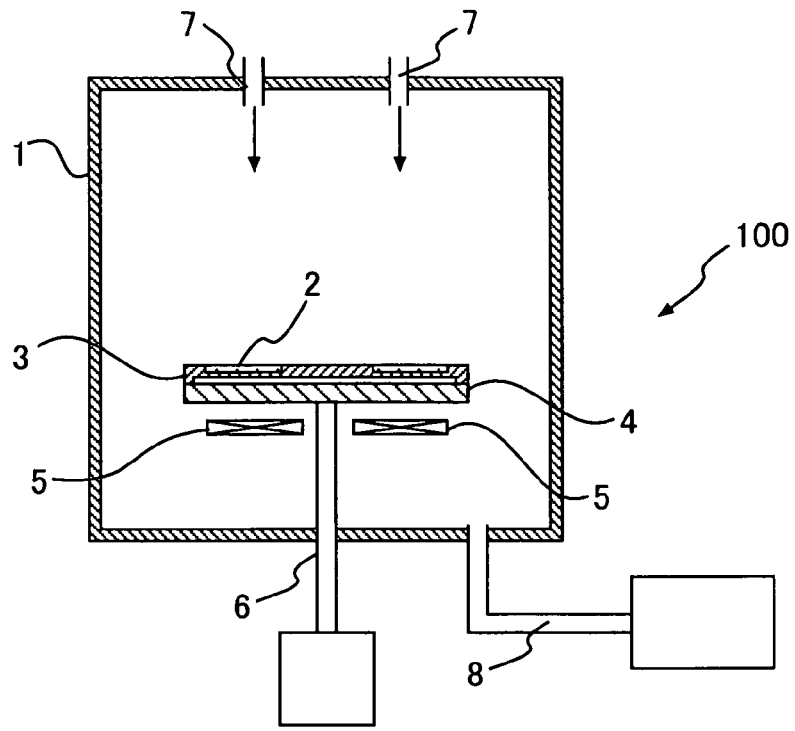
[FIG. 1] This is a cross-sectional view schematically showing a construction of a vapor phase growth apparatus according to an embodiment.

1 Reactor
2 Wafer
3 Wafer holder (wafer containing member)
3a Pocket hole
3b Dome-shaped recess portion
3c Contact portion
4 Susceptor (heat uniformizing member)
5 Heater (heating member)
6 Rotation mechanism
7 Gas inlet pipe (gas supply member)
8 Gas exhaust pipe
100 Vapor phase growth apparatus

BEST MODE FOR CARRYING OUT THE INVENTION

Hereinafter, an embodiment of a vapor phase growth apparatus (MOCVD apparatus) according to the present invention is described with reference to the drawings. Note that it should be obvious that the present invention is not limited by the embodiment described below.

Figure 2:
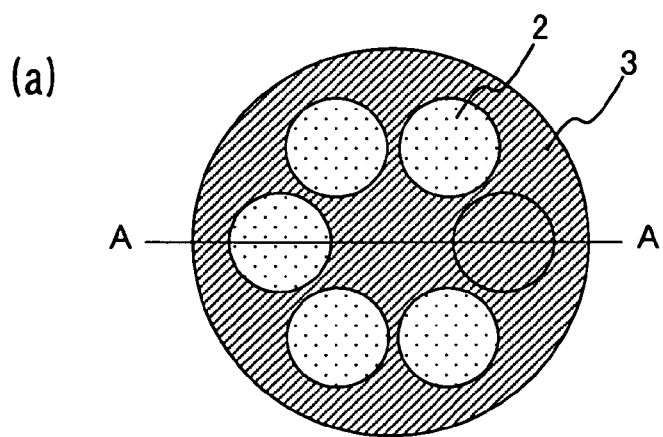
[FIG. 2] These are enlarged views showing a construction of a wafer holder 3 of the embodiment in detail, (a) is a top view thereof, and (b) is a cross sectional view thereof.
Figure 2:
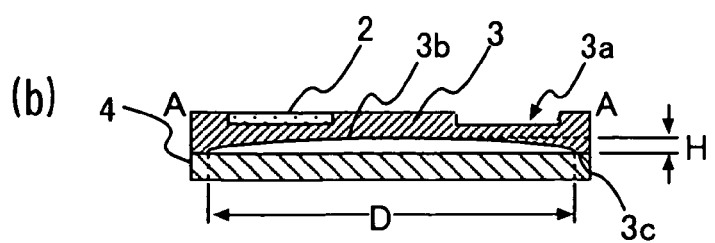

FIG. 1 is a cross-sectional view showing an example of a construction of a vapor phase growth apparatus according to this embodiment. FIG. 2 is enlarged views showing the construction of a wafer holder 3 in detail, and, (a) is a plan view thereof and (b) is a cross-sectional view taken along the line A-A of (a).

As shown in FIGS. 1 and 2, the vapor phase growth apparatus 100 includes a reactor 1, a wafer holder 3 serving as a wafer containing member on which wafers 2 are mounted, a susceptor 4 which holds the wafer holder 3 and which serves as a heat uniformizing member for uniformizing heat from a heating member, and a heater 5 provided below the susceptor 4, a rotation mechanism 6 which rotatably supports the wafer holder 3 and the susceptor 4, gas inlet pipes 7 which supply raw material gas and carrier gas, a gas exhaust pipe 8 which exhausts unreacted gas, and the like.

Each wall of the vapor phase growth apparatus 100 is made of, for example, stainless steel. The gas inlet pipes 7 are installed in the central part of the top wall, and introduce the group 13 (3B) raw material gas such as trimethylindium (TMI), trimethylaluminum (TMAl), and trimethylgallium (TMG), the group 15 (5B) raw material gas such as arsine ($AsH_3$) and phosphine($PH_3$), and inert gas such as hydrogen ($H_2$) as carrier gas into the reactor.

The wafer holder 3 is made of a member formed into a disc shape. On one side of the wafer holder 3, a plurality (6 in FIG. 2) of circular pocket holes 3a for placing the wafers 2 are formed, and the other side comes in contact with the susceptor 4. In addition, in the wafer holder 3 of this embodiment, a recess portion 3b depressed in a dome shape is formed on the side which comes in contact with the susceptor 4, with a predetermined interval from the circumference edge of the wafer holder 3. The wafer holder 3 and the susceptor 4 come in contact with each other at contact surface 3c of the circumferential edge portion of the wafer holder 3.

The susceptor 4 is made of a material with high thermal conductivity (for example, molybdenum) to transfer heat from the heater 5 uniformly, and is rotatably supported by the rotation mechanism 6. The heater 5 for heating the wafers 2 is positioned below the susceptor 4 concentrically.

The gas inlet pipes 7 are provided in the top wall of the reactor 1, and the gas exhaust pipe 8 is provided in the bottom wall of the reactor 1. Raw material gas introduced into the reactor 1 through the inlet openings via the gas inlet pipes 7 is decomposed in the upstream side within the reactor, and then travels to the downstream side, forming thin films on the wafers 2. Unreacted raw material gas is exhausted together with carrier gas to outside from the gas exhaust pipe 8 via an exhaust opening.

Moreover, although not illustrated, water cooling jackets are provided, for example, on the outer circumference of the rotation mechanism 6 and on the external wall of the lower wall surface of a reactor so that temperature within the reactor 1 is controlled by these water cooling jackets and the heater 5.

In the vapor phase growth apparatus 100 described above, by heating with the heater 5 from the bottom of the susceptor 4, heat is transferred to the wafers 2 via the susceptor 4, a space formed by the dome-shaped recess portion 3b, and the wafer holder 3, to allow the wafers 2 to reach a predetermined temperature. Moreover, by rotating the susceptor 4 using the rotation mechanism 6 at a predetermined rotating speed, raw material gas and carrier gas introduced from the gas inlet pipes 7 is supplied evenly over the surfaces of the wafers 2 to perform vapor phase growth of thin films.

The wafer holder 3 of this embodiment has a diameter of 180 mm and a thickness of 10 mm. Each of the pocket holes 3a provided on the surface of the wafer holder 3 has a diameter of 50 mm and a height of 0.5 mm, and the dome-shaped recess portion 3b provided in the back surface of the wafer holder 3 has a diameter (D) of 170 mm and a height (H) of 1.7 mm. In other words, the recess portion 3b provided on the back surface side of the wafer holder 3 is formed so that a ratio H/D of its height (H) and diameter (D) is 1.0%.

By forming the wafer holder 3 into the above shape, a space is formed between the wafer holder 3 and the susceptor 4, the closer to the central portion of the dome-shaped recess portion 3b, the slower heat transmission becomes. In this way, although temperature of the central portion of the conventional wafer holder 3 was higher then other areas, a temperature difference between the central portion and the edge portion of the wafer holder 3 of this embodiment is significantly reduced. As a result, heat is transmitted uniformly to the wafers 2 mounted on the wafer holder 3 to attain a uniform in-plane temperature distribution of the wafers 2.

When vapor phase growth of thin films on InP wafers 2 was actually performed using a vapor phase growth apparatus in which the wafer holder 3 of this embodiment was applied, variation of the in-plane temperature distribution on the surface of each wafer 2 was 1° C. or smaller, and almost uniform temperature could be achieved. Moreover, vapor phase growth of a thin film with good uniformity was achieved as well over the entire surface area of each wafer 2.

Hereinbelow, results of examinations carried out against the shape (height) of the dome-shaped recess portion formed in the back side of the wafer holder 3 are described.

Figure 3:
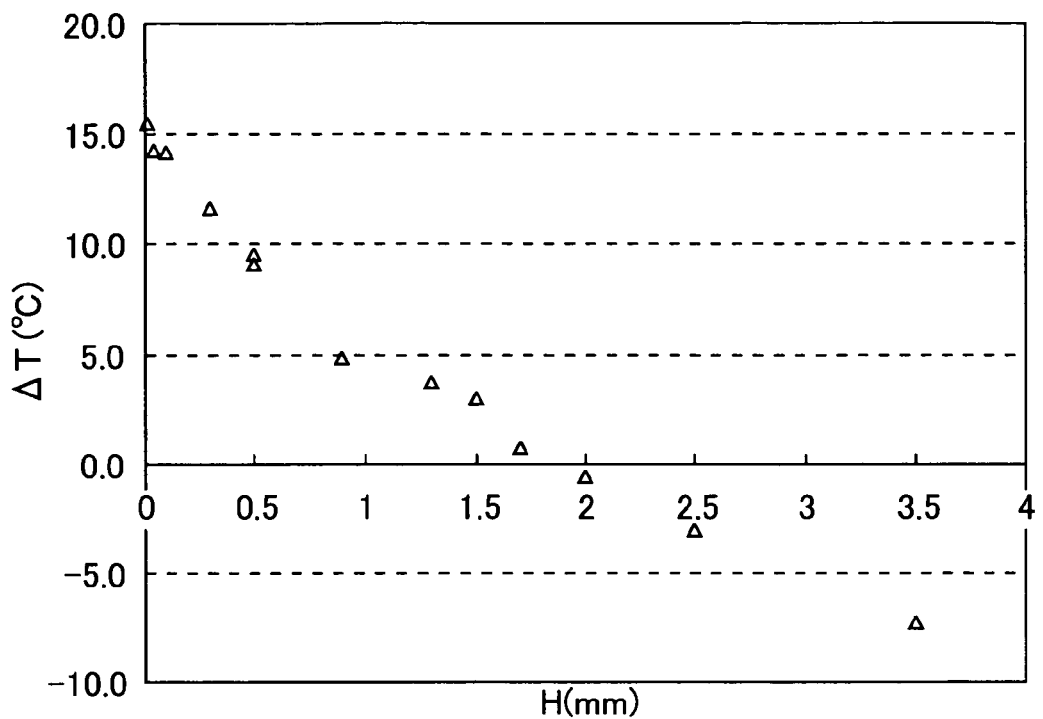
[FIG. 3] This is a graph showing a relation between a height H (mm) of a dome-shaped recess portion 3b formed in the wafer holder 3, and a temperature difference ΔT (° C.) on a surface of the wafer holder.
Figure 4:
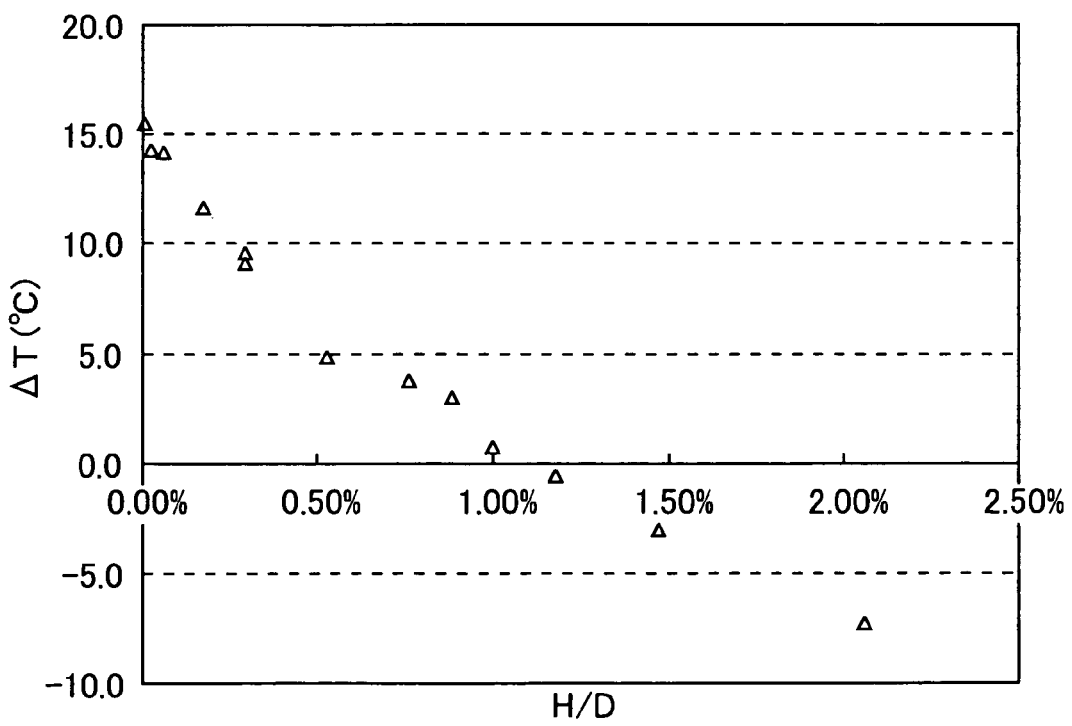
[FIG. 4] This is a graph showing a relation between a ratio H/D of the height and the diameter of the dome-shaped recess portion 3b, and a temperature difference ΔT (° C.) on a surface of the wafer holder.
Figure 5:
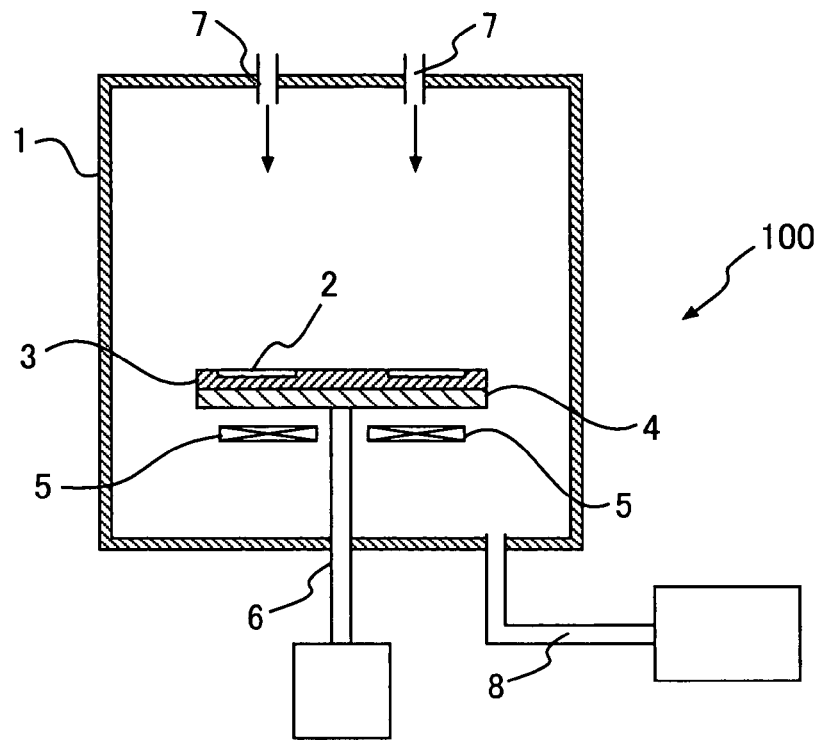
[FIG. 5] This is a cross-sectional view schematically showing a construction of a conventional vapor phase growth apparatus.
Figure 6:
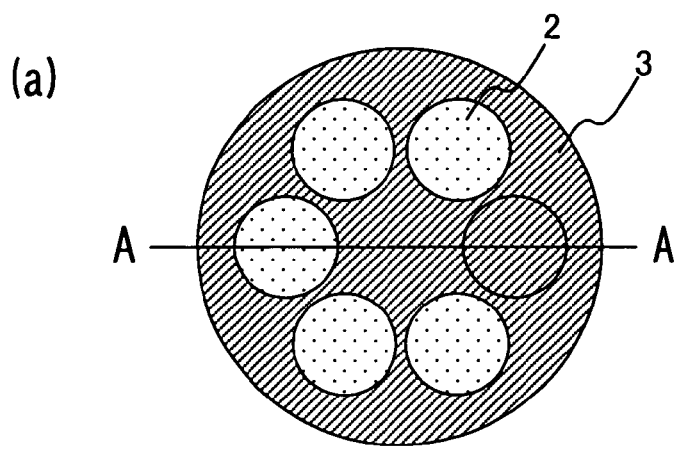
[FIG. 6] These are enlarged views showing a construction of a conventional wafer holder 3 in detail, (a) is a top view thereof, and (b) is a cross-sectional view thereof.
Figure 6:
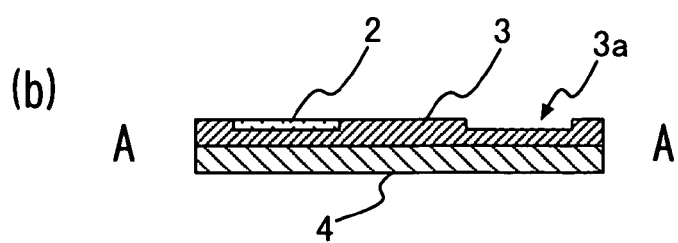

FIG. 3 is a graph showing a relation between the height H (mm) of the dome-shape recess potion 3b formed in the wafer holder 3, and a temperature difference ΔT (° C.) on the surface of the wafer holder, and FIG. 4 is a graph showing a relation between a ratio H/D of the height and the diameter of the dome-shaped portion 3b, and a temperature difference ΔT (° C.) on the surface of the wafer holder. Here, temperature of a part immediately above the peak of the dome-shaped recess potion 3b is represented as central portion temperature Tin, and temperature of a part immediately above the contact portion 3c of the wafer holder 3 with the susceptor 4 is represented as edge portion temperature Tout. In this case, a temperature difference obtained by Tin—Tout is represented by a temperature difference ΔT on the surface of the wafer holder. Further, the diameter D of the dome-shaped recess portion 3b was 170 mm, and temperature of the heater 5 was set at 640° C.

As seen from FIGS. 3 and 4, the temperature difference ΔT on the surface of the wafer holder is reduced as the height H of the dome-shaped recess portion 3b is increased, and therefore, it can be said that there is a correlation between the height H and the temperature difference ΔT. Also, When the height H was within a range from 0.02 to 3.5 mm (a range of a ratio of the height and diameter H/D from 0.01 to 2.1%), the temperature difference ΔT was 15° C. or smaller, and in particular, when the height H was within a range from 0.9 to 2.5 mm (a range of a ratio the height and diameter H/D from 0.50 and 1.50%), the temperature difference ΔT was 5° C. or smaller.

Meanwhile, temperature measurement of a wafer holder surface was carried out using a wafer holder with a construction where the height H of the dome-shaped recess portion 3b of 0 mm, in other words, with a construction similar to the conventional one where the entire surface of the wafer holder 3 is in contact with the susceptor 4. As a result, a temperature difference between the central portion and the edge portion was 15° C. This proved that, by providing a dome-shaped recess portion 3b in the back side of the wafer holder 3 like this embodiment, a temperature distribution on the surface of the wafer holder 3 was uniformed.

Furthermore, since it is considered that the larger the space formed by the dome-shaped recess portion 3b becomes, the larger a loss of heat transmission efficiency becomes, an examination was carried out to check a heat loss against the height H of the recess portion 3b. As a result, it was found that when the height H of the dome-shaped recess portion 3b was between 3.0 and 3.5 mm, the temperature of the wafer holder 3 reached 607° C. against the set temperature 640° C. of the heater 5, and that the heat transmission efficiency is reduced. Accordingly, it is preferred that the height H of the dome-shape recess portion 3b be set between 0.02 and 3.0 mm, so that a heat loss due to heat transmission via the space can be minimized.

The embodiment of the present invention proposed by the inventors has been specifically described. However, the present invention is not limited to the foregoing embodiment, and the embodiment can be modified without departing from the gist of the invention.

For example, the dome-shaped recess portion 3b may be provided with a projection in order to improve a temperature distribution of the wafer holder 3, or the wafer holder 3 and the susceptor 4 may become in contact with each other locally through the projection. Alternatively, the projections can be formed in a row to divide the space formed by the dome-shaped recess portion 3b.

Moreover, the material for the wafer holder 3 is not particularly limited, and may be any material unless it has properties that cause contamination of grown crystals and atmosphere within the reactor 1. However, in order to improve heat transmission efficiency from the heater 5, it is preferred to use materials having heat conductivity of 50 W/mK or larger but not exceeding 500 W/mK, such as graphite and molybdenum.

In the aforementioned embodiment, a recess portion 3b is provided in the wafer holder 3 corresponding to the pocket holes 3a to form a space. However, a susceptor 4 and the wafer holder 3 can be spaced apart by a predetermined distance by using an appropriate jig.

The invention claimed is:

1. A vapor phase growth apparatus comprising at least a sealable reactor, a wafer containing member installed within the reactor and having a plurality of wafer mounting portions along the same circumference on a front surface thereof for holding a plurality of wafers, a gas supply member for supplying raw material gas towards the wafers, a heating member for heating the wafers, and a heat uniformizing member for holding the wafer containing member and uniformizing heat from the heating member, the heating uniformizing member having approximately the same size as the wafer containing member, and wherein raw material gas is supplied into the reactor in a high temperature environment while heating the wafer by using the heating member via the heat uniformizing member and the wafer containing member, to form a film grown on a surface of the wafer, wherein a recess portion depressed in a dome shape is formed at a back surface of the wafer containing member to form a gap between the wafer containing member and the heat uniformizing member, and the recess portion is formed so that (i) an apex of the dome shape is arranged on a straight line connecting a center of the wafer containing member with a center of the heating uniformizing member and (ii) a maximum height of the gap is at the apex of the dome shape, wherein the wafer containing member comprises a material having a heat conductivity of 50 W/mK or larger but not exceeding 500 W/mK, and wherein, when a height and a diameter of the recess portion provided in the wafer containing member are represented by H and D, respectively, the height H is within a range from 0.02 mm to 3.5 mm and a ratio of the height and the diameter H/D is between 0.01 and 2.10%.

2. The vapor phase growth apparatus according to claim 1, wherein the ratio of the height and the diameter H/D is between 0.50 and 1.50%.

3. The vapor phase growth apparatus according to any one of claims 1 and 2, wherein the height H of the recess portion provided in the wafer containing member is between 0.02 and 3.00 mm.

4. The vapor phase growth apparatus of claim 1, wherein the temperature difference $\Delta T$ between a center portion of the wafer containing member and an edge portion of the wafer containing member is 15° C. or less.

5. The vapor phase growth apparatus of claim 1, wherein the temperature difference $\Delta T$ between a center portion of the wafer containing member and an edge portion of the wafer containing member is 5° C. or less.

6. The vapor phase growth apparatus of claim 1, wherein variation of the in-plane temperature distribution on the surface of the wafer is 1° C. or less.

* * * * *